(12) United States Patent
Ronay

(10) Patent No.: US 6,238,469 B1
(45) Date of Patent: May 29, 2001

(54) DUAL-VALENT RARE EARTH ADDITIVES TO POLISHING SLURRIES

(75) Inventor: Maria Ronay, Briarcliff Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/226,191

(22) Filed: Jan. 7, 1999

Related U.S. Application Data

(62) Division of application No. 08/756,361, filed on Nov. 27, 1996, now Pat. No. 6,110,396.

(51) Int. Cl.⁷ .................................. B24B 1/00; C09G 1/02
(52) U.S. Cl. .................................. 106/3; 51/307; 51/309; 438/693
(58) Field of Search .......................... 51/307, 308, 309; 106/3; 438/692, 693; 501/127, 152; 423/263

(56) References Cited

U.S. PATENT DOCUMENTS

| | | | |
|---|---|---|---|
| 2,566,615 | 9/1951 | Kellholtz | 41/42 |
| 3,429,080 * | 2/1969 | Lachapelle | 51/309 |
| 4,478,883 | 10/1984 | Bupp et al. | 427/97 |
| 4,554,182 | 11/1985 | Bupp et al. | 427/304 |
| 4,752,628 | 6/1988 | Payne | 523/122 |
| 5,225,034 | 7/1993 | Yu et al. | 156/636 |
| 5,262,354 | 11/1993 | Cote et al. | 437/195 |
| 5,304,284 | 4/1994 | Jagannathan et al. | 156/666 |
| 5,382,272 * | 1/1995 | Cook et al. | 51/309 |
| 5,445,996 | 8/1995 | Kodera et al. | 437/225 |
| 5,480,476 | 1/1996 | Cook et al. | 106/3 |
| 5,603,739 | 2/1997 | Neuland | 51/298 |
| 5,639,296 | 6/1997 | Garino | 106/456 |
| 5,876,490 * | 3/1999 | Ronay | 51/309 |

FOREIGN PATENT DOCUMENTS

| | | |
|---|---|---|
| 0 373 501 A2 | 6/1990 | (EP) . |
| WO 96/38262 | 12/1996 | (WO) . |

* cited by examiner

*Primary Examiner*—Michael Marcheschi
(74) *Attorney, Agent, or Firm*—Connolly, Bove, Lodge & Hutz LLP; Daryl K. Neff

(57) ABSTRACT

A slurry containing abrasive particles and a dual-valent rare earth ion or suspension of its colloidal hydroxide is especially useful for polishing surfaces, including those used in microelectronics. A suspension of a colloidal dual-valent rare earth hydroxide is especially useful for polishing silica.

5 Claims, 2 Drawing Sheets

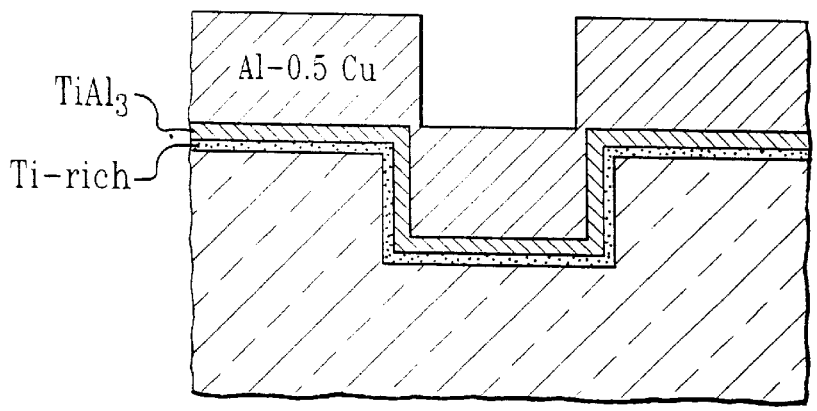
FIG. 2a
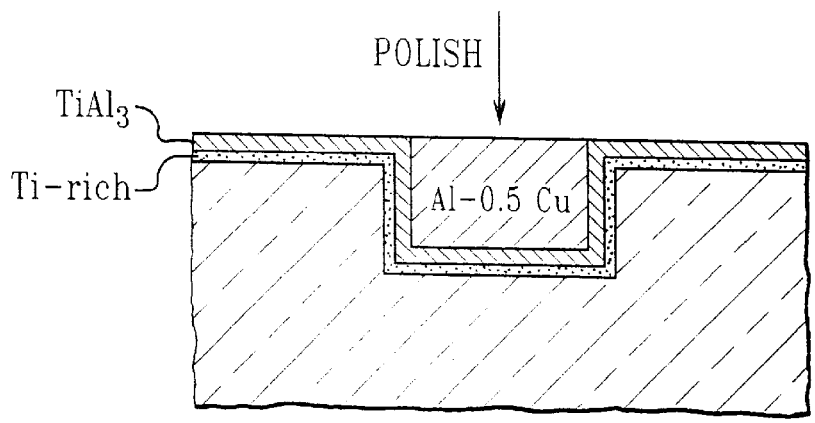
FIG. 2b
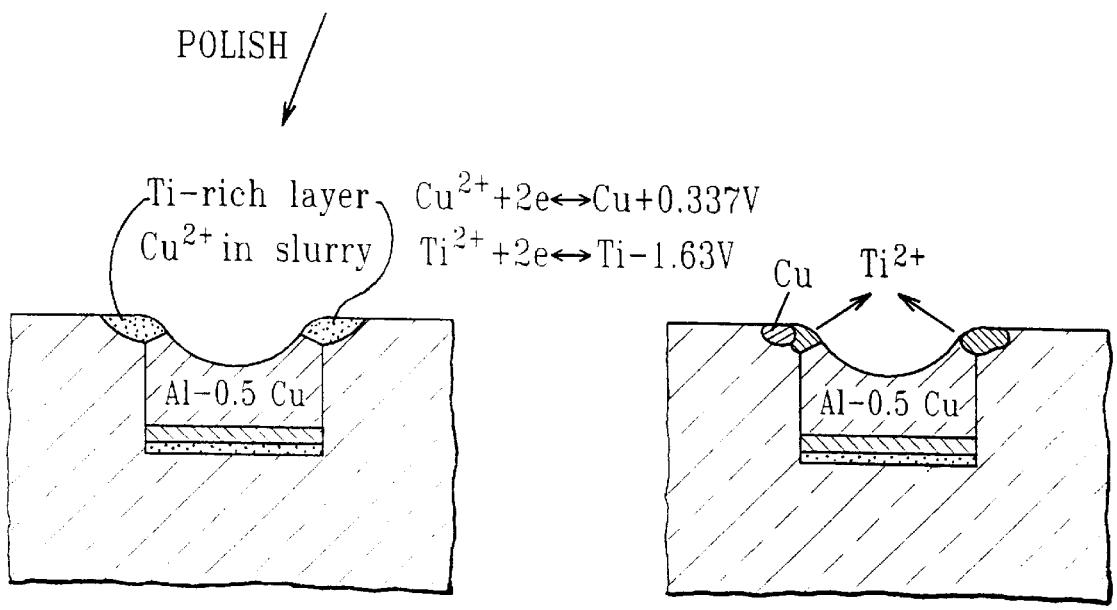
FIG. 2c
FIG. 2d

DUAL-VALENT RARE EARTH ADDITIVES TO POLISHING SLURRIES

CROSS REFERENCE TO RELATED APPLICATION

This application is a divisional of application Ser. No. 08/756,361, filed Nov. 27, 1996, now Pat. No. 6,110,396.

TECHNICAL FIELD

The present invention is concerned with slurry compositions that are especially suitable for polishing surfaces. The present invention finds particular applicability in microelectronics. However, the slurry compositions can also be used for other substrates, including glass. The slurries of the present invention exhibit enhanced polishing characteristics.

BACKGROUND OF THE INVENTION

In the microelectronics industry, surfaces that are typically scratch-free are polished for the purpose of planarizing the structure involved and/or removing unwanted material. By way of example, metals such as aluminum, copper, and tungsten are planarized. These metal surfaces are oxidized so that the polishing abrasive does not produce scratches. Moreover, there is typically a refractory metal liner underneath the aluminum, copper or tungsten providing good adhesion to the underlying insulator and good contact resistance to lower level metallizations. The liners can be niobium, tantalum and titanium alone or in combination with their nitrides, or any other refractory metal. In the dual Damascene process used for back end of the line (BEOL) applications, the line width of the metal, as well as of the $SiO_2$ that separates them is very narrow. If the polishing process erodes the $SiO_2$ lines, the metal lines will erode with them and their resistance will go up. Therefore, it would be desirable to provide a polishing slurry for which the liner may act as a polish stop.

Because the aluminum alloy fills the trenches etched in the insulator, the continuous aluminum layer above them is thinner with half the trench depth than above the unpatterned fields, assuming metal line width and $SiO_2$ space width are the same. In order to remove the aluminum alloy from the fields, the patterned area is being polished long after the continuous aluminum film above it has been removed. Unless there is a robust polish stop on top of the thin $SiO_2$ lines, the patterned area will greatly erode, leading to overly high resistance.

In another problem involved in the microelectronics industry, an exemplary conductor for BEOL applications is an aluminum copper alloy in which the percentage of copper is in the order of 0.5 wt. %. Underneath the liner is titanium, which forms $TiAl_3$ when exposed to temperatures in excess of 350° C. This metallurgy was used for the reactive ion etching process in the past, in which the metal is patterned and the insulator is polished. In the new Damascene technology where the insulator is patterned and the aluminum alloy fills the pattern by a reflow process, the excess aluminum is removed by polishing with a water-based slurry. The copper from the Al—Cu alloy goes into solution during polishing. When the polishing process reaches the titanium-rich layer underneath the $TiAl_3$ layer, the copper plates out on it by electroless plating. The reason for this is that copper is much more electropositive than active titanium (titanium does not become passive during prior art polishing).

In the area of $SiO_2$ polish, the most frequently used abrasive is silica, which however, does not give high polishing rates. Furthermore, certain commercially available silica slurries contain nickel impurities. When these slurries are used in microelectronics applications for the polishing of $SiO_2$ insulators, the nickel impurity plates out on or adjacent to tungsten studs, causing a loss of reliability because of shorts.

SUMMARY OF THE INVENTION

The present invention provides slurry compositions suitable for polishing that overcome the above discussed problems of the prior art. In particular, the present invention provides slurries with which refractory metal liners act as a polish stop. Also, slurries of the present invention provide for enhanced polishing. The slurries of the present invention prevent copper and nickel when present, from plating out.

The present invention is directed to slurry containing abrasive particles and a dual-valent rare earth ion or suspension of its colloidal hydroxide. The rare earth ion must be in its higher valent form. The amount of the abrasive particles is about 0.2 to about 20 percent by weight and the amount of the dual-valent rare earth ion or hydroxide is about 0.05 to about 2 percent by weight. These amounts are based upon the total of abrasive particles and rare earth ion or hydroxide in the slurry.

The present invention is also concerned with a method for polishing a surface. The method comprises providing on the surface to be polished, a slurry of the type disclosed above. The surface is then polished by contacting the surface having the slurry thereon with a polishing pad.

In addition, the present invention is concerned with a suspension containing 0.05 to about 2 percent by weight of a colloidal dual valent rare earth hydroxide wherein the rare earth is in its higher valent state.

The present invention is also concerned with a method for polishing a silica substrate using the above disclosed suspension. The method comprises providing on the surface to be polished a suspension of the type disclosed above. The silica is then polished by contacting it with a polishing pad. This process does not require abrasives.

SUMMARY OF DRAWINGS

FIGS. 2a–2d show the proposed mechanism of copper plate-out on a BEOL structure when prior art slurry is used.

BEST AND VARIOUS MODES FOR CARRYING OUT THE INVENTION

Figure 1A:
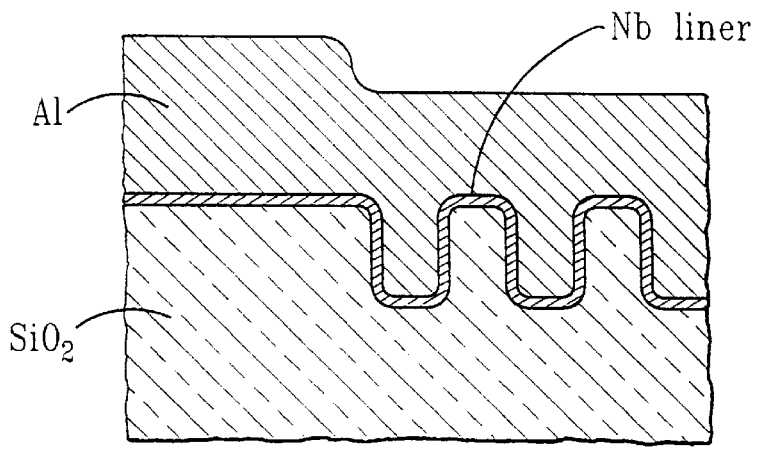
FIGS. 1a–1c are a schematic representation of a Damascene structure polished according to the present invention.

According to one aspect of the present invention, a slurry comprising abrasive particles and a dual-valent rare earth ion or suspension of its colloidal hydroxide is provided. The higher valent form of the rare earth is employed. Examples of some rare earths suitable for the present invention include $Ce^{4+}$, $Pr^{4+}$ and $Tb^{4+}$ or suspensions of their colloidal hydroxides, such as, for example, $Ce(OH)_4$. The dual-valent rare earth ion or rare earth hydroxide colloid acts as an oxidation catalyst and source of OH ions in the polishing slurry.

The dual-valent rare earth are especially effective in enhancing polish processing of aluminum, copper and tungsten. In addition, as donors of OH radicals, the higher-valent form of colloidal dual-valent rare earth hydroxide slurries by themselves or in combination with other abrasives give faster $SiO_2$ polishing rates then prior art polishing slurries used in the microelectronics industry. The colloidal hydroxides can release a free OH radical and accelerate the depolymerization of $SiO_2$ leading to increased $SiO_2$ polishing rates.

In addition, the additives of the present invention turn refractory metal liners, such as Nb, Ta, and Ti, when present in the structure being polished, into polish stops.

The rare earth ions act as oxidation catalysts in the acidic pH regime, while their colloidal hydroxides act as such in the neutral and alkaline pH regime. Accordingly, the dual valent rare earth polishing additives act in the entire pH regime. Accordingly, the present invention can be used in a broad range of polishing applications, and can be mild or aggressive in their action, depending on pH.

The abrasive particles employed include those conventionally used in polishing slurries. Examples of suitable abrasive particles include alumina, silica, zirconia, and ceria.

The abrasive particles typically have a particle size of about 10 to about 1000 nm and preferably about 50 to about 100 nm.

The amount of abrasive particles is about 0.2 to about 20 percent by weight and preferably about 1 percent to about 5 percent by weight. The amount of the dual-valent rare earth ion or hydroxide is about 0.05 to about 2 percent by weight and preferably about 0.1 to about 0.6 percent by weight. These amounts are based upon the total of abrasive particles and rare earth ion or hydroxide in the slurry.

The slurry is preferably an aqueous slurry.

Concerning the suspension aspect of the present invention, such contains about 0.05 to about 2 percent by weight and preferably about 0.1 to about 0.6 percent by weight of colloidal dual valent rare earth hydroxide, wherein the rare earth is in its higher valent form. The hydroxide particles typically have a diameter of about 5 to about 100 nm, a specific example being about 20 nm. They provide a much greater source of (OH) radicals than, for instance, fired $CeO_2$ particles. The typical $CeO_2$ particles have diameters in the range of about 1 micron and their total surface area is significantly smaller than the surface area of colloidal particles.

Cerium dioxide particles produced from fired ceria and milling are used in the optics industry, but not in the microelectronics industry, because the fairly large particles do not form stable suspensions in aqueous environment. Furthermore, it takes in the order of 100 hours run-in time on a pad to establish stable polishing rates. Run-in time is the time needed to bring up their concentration on the polishing pad to the required level.

The parameters of the polishing or planarizing can be determined by those skilled in the art once aware of this disclosure, without exercising undue experimentation. For instance, the speed of rotation of the polishing pads is about 10 to about 150 rpm, and the speed of the rotation of the wafer carrier is about 10 to about 150 rpm and the down force about 2 to about 10 psi. The polishing pads are those conventionally used in polishing for microelectronics.

Surfaces that may be polished according to the present invention include silicon dioxide and a material containing silicon and oxygen atoms such as a flowable oxide. Of course, the surface may include other materials, including others disclosed above.

The following non-limiting examples are presented to further illustrate the present invention.

EXAMPLE 1

Figure 1B:
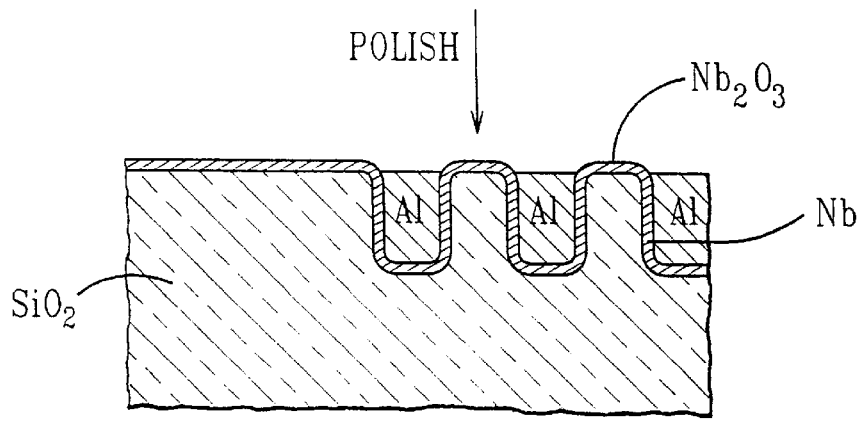
Figure 1C:
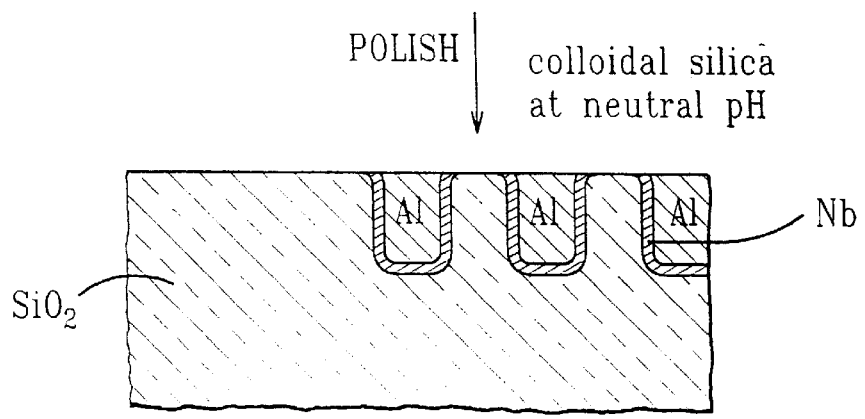

A structure having an aluminum alloy deposited onto patterned $SiO_2$, (a so-called Damascene structure), (see FIG. 1) is subjected to planarizing. The aluminum layer above the patterned $SiO_2$ is thinner by about one-half the trench depth than above the unpatterned $SiO_2$ fields. Therefore, in order to remove the aluminum alloy from the fields, the patterned area would be polished long after the continuous aluminum film above it has been removed. Unless there is a robust polish stop on top of the thin $SiO_2$ lines, as achieved by the present invention, the patterned area will greatly erode leading to overly high resistance. A niobium liner, such as that disclosed in co-pending U.S. patent application Ser. No. 08/691,704 Pat. No. 5,994,241, the entire disclosure of which is hereby incorporated by reference, may be present on top of the $SiO_2$.

The polishing slurry employed contains of about 3% by weight of colloidal alumina of about 75 nm particle size at a pH of about 4 in water and about 3.5 gram per liter water soluble $(NH_4)_2Ce(NO_3)_6$. The cerium is the 4-valent cerium. After the addition of the cerium compound, the pH of the slurry is 2. This slurry polishes the aluminum alloy at a rate of about 300 nm per minute, using a Polytex (Rodel) polishing pad at a rotation speed of about 50/50 rpm, and pressure of about 6 psi. When the polishing process reaches the niobium liner on top of the $SiO_2$ lines, the $Ce^{4+}$ions oxidize the niobium liner to $Nb_2O_5$, and the polishing process stops there, preventing the erosion of the narrow $SiO_2$ lines. Polishing of the aluminum in the unpatterned field however continues until the niobium liner is reached there.

A colloidal silica slurry is then used to remove the oxidized niobium, which it does with ease. The use of a slurry additive, according to the present invention, that makes the liner act as a polish stop, prevents the erosion of patterned areas and also eliminates the ill effects of the non-uniformity of polish rates that is experienced between the edges and the center of the wafers.

EXAMPLE 2

The process of Example 1 is repeated except that copper is used in place of aluminum alloy and tantalum, or its nitride are used in place of the niobium liner. The results obtained are similar to those discussed above, except that the primary metal polish rate for copper can be even higher than that for aluminum. This may be due to the copper being more prone to oxidation by the dual-valent rare earth ions than is the surface of aluminum, and because the copper oxides are mechanically softer than aluminum oxide.

EXAMPLE 3

The process of Example 1 is repeated except that tungsten is used in place of aluminum alloy and titanium or its nitride is used in place of the niobium liner. The results obtained are similar to those of Example 1.

EXAMPLE 4

The structure illustrated in FIG. 2 is subjected to planarizing. The structure illustrates a conductor for BEOL applications of an aluminum copper alloy containing about 0.5 wt. % of copper. Underneath the alloy is a titanium liner which forms $TiAl_3$ when exposed to temperatures in excess of 350° C. As shown, where the insulator is patterned and the aluminum alloy fills the pattern (e.g., by a reflow process) the excess aluminum must be removed by polishing. The copper from the Al—Cu alloy goes into solution during polishing. When the polishing process reaches the titanium-rich layer in the liner, the copper, according to prior art techniques, plates out on it by electroless plating. Copper is much more electropositive than active titanium.

However, the rare earth additives of the present invention convert the copper ions to insoluble copper oxide, and also oxidize the titanium-rich bottom layer of the liner: both events preventing copper plate-out.

The same polishing slurry as employed in Example 1 is used in this example. The copper plate-out is prevented and the aluminum is planarized.

EXAMPLE 5

Example 4 is repeated except that the polishing slurry is an aqueous slurry containing about 10 wt. % silica and about 0.13 wt. % (Ce(OH)$_4$. The pH of this slurry is near neutral (pH of 7.7) and thus it is non-corrosive.

This slurry is prepared adding about 2 liters of 30N50 Klebosol to about 2 liters of water. 30N50 Klebosol (Hoechst) contains 30 wt. % silica particles of 50 nanometer diameter and has a pH of 9.86. To this is added under vigorous stirring a solution of 6×3.5 g $(NH_4)_2Ce(NO_3)_6$ dissolved in 2 liters of water. The results obtained are similar to those of Example 4.

EXAMPLE 6

Example 4 is repeated except that the polishing slurry is an aqueous slurry containing 10 wt. % silica and about 0.11 wt. % colloidal Ce(OH)$_4$ at a near neutral pH.

The slurry is prepared by dissolving 4×3 g $(NH_4)_2Ce(NO_3)_6$ in 1 liter water. 4×1.5 g solid KOH is dissolved in another 1 liter of water and added to the ceria solution under vigorous stirring. The Ce(OH)$_4$ forms a pale yellow colloidal precipitate. Two liters of this colloid suspension is mixed into 2 liters of a commercially available silica slurry of neutral pH. The silica slurry has a 20 wt. % concentration of silica.

EXAMPLE 7

Silicon dioxide and in particular TEOS oxide is polished with a slurry containing 0.6 wt. % Ce(OH)$_4$ at a pH of 8.9.

The polishing is carried out using a Pan-W pad (Freudenberg) at a pressure of 5 psi and 100/100 rpm on platen and carrier, respectively. The polishing rate obtained is about 200 nm per minute. The polishing rate under similar conditions using an alkaline silica slurry containing 10 wt. % silica at a pH of 10.2, which is used widely in the microelectronics industry, gives a polishing rate of only 70 nm per minute.

Polishing using similar conditions with the above alkaline silica slurry to which is added about 0.6 wt. % of colloidal Ce(OH)$_4$ increases the polishing rate by about 70%.

EXAMPLE 8

Example 7 is repeated except that the slurry contains about 1 wt. % fired CeO$_2$ (1 micron diameter particles) and 0.6 wt. % colloidal Ce(OH)$_4$ at a pH of 8.9. The polishing rate is about 500 nm per minute without any run-in time, from the first wafer on, and the rate remains stable.

Run-in time refers to the time needed to bring up the concentration of the polishing agent on the polishing pad to its required level.

EXAMPLE 9

A TEOS oxide is polished using a slurry containing 1 part SC-1 silica dispersion (Cabot) per 2 parts water providing 10% by weight silica, and containing about 0.5 wt. % colloidal Ce(OH)$_4$ and having a pH of 8.84. The Ce(OH)$_4$ is prepared from aqueous solutions of $(NH_4)_2Ce(NO_3)_6$ and K(OH) in 2:1 ratio. The polishing is carried out on a stack of SubaIV/IC1000 pads at 8 psi downforce and 50/50 rpm. The polishing rate is 170 nm per minute.

COMPARISON EXAMPLE 10

Example 9 is repeated except that the slurry does not contain the Ce(OH)$_4$ and has a pH of 10.18. The polishing rate is reduced to 100 nm per minute.

EXAMPLE 11

Example 9 is repeated except that the Ce(OH)$_4$ is prepared from a 3:2 ratio of cerium salt and K(OH) resulting in a pH of 9.6, and the polishing is carried out with 5 psi downforce. The polishing rate is 120 per minute.

COMPARISON EXAMPLE 12

Example 11 is repeated except that the slurry does not contain the Ce(OH)$_{,4}$. The polishing rate is 70 nm per minute.

What is claimed is:

1. A slurry, comprising:
   alumina abrasive particles and a dual-valent rare earth ion wherein said rare earth ion is in its 4+ valent form, and wherein the amount of said abrasive particles is about 0.2 to about 20 percent by weight and the amount of said dual-valent rare earth ion dissolved in said slurry is about 0.05 to about 2 percent by weight, the amounts being based upon the total of abrasive particles and rare earth ion in said slurry and wherein said slurry has an acidic pH.

2. The slurry of claim 1 wherein, said rare earth is selected from the group consisting of $Ce^{4+}$, $Pr^{4+}$, $Tb^{4+}$ and mixtures thereof.

3. The slurry of claim 1, wherein said rare earth is $Ce^{4+}$.

4. The slurry of claim 1, wherein said abrasive particles have a particle size of about 10 to about 1000 nm.

5. The slurry of claim 1 being an aqueous slurry.

* * * * *